US012720720B2

(12) United States Patent
Yang et al.

(10) Patent No.: US 12,720,720 B2
(45) Date of Patent: Aug. 25, 2026

(54) SEMICONDUCTOR DEVICE HAVING AN OFFSET SOURCE/DRAIN FEATURE AND METHOD OF FABRICATING THEREOF

(71) Applicant: Taiwan Semiconductor Manufacturing Company, Ltd., Hsinchu (TW)

(72) Inventors: Chih-Chuan Yang, Hsinchu (TW); Chia-Hao Pao, Kaohsiung City (TW); Wen-Chun Keng, Hsinchu County (TW); Lien Jung Hung, Taipei (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 944 days.

(21) Appl. No.: 17/869,480

(22) Filed: Jul. 20, 2022

(65) Prior Publication Data

US 2022/0367483 A1 Nov. 17, 2022

Related U.S. Application Data

(62) Division of application No. 16/949,103, filed on Oct. 14, 2020, now Pat. No. 11,600,625.

(51) Int. Cl.

| | |
|---|---|
| ***H10B 10/00*** | (2023.01) |
| ***H10D 30/01*** | (2025.01) |
| ***H10D 62/13*** | (2025.01) |

(52) U.S. Cl.

CPC ......... *H10B 10/125* (2023.02); *H10D 30/024* (2025.01); *H10D 62/151* (2025.01)

(58) Field of Classification Search

CPC .......................... H10D 84/017; H10D 84/0158

See application file for complete search history.

(56) References Cited

U.S. PATENT DOCUMENTS

| | | | | |
|---|---|---|---|---|
| 9,818,872 | B2 | 11/2017 | Ching et al. | |
| 9,887,269 | B2 | 2/2018 | Ching et al. | |
| 9,899,398 | B1 | 2/2018 | Colinge et al. | |
| 10,032,627 | B2 | 7/2018 | Lee et al. | |
| 10,109,721 | B2 | 10/2018 | Lin et al. | |
| 10,157,799 | B2 | 12/2018 | Ching et al. | |
| 10,199,502 | B2 | 2/2019 | Huang et al. | |
| 10,290,546 | B2 | 5/2019 | Chiang et al. | |
| 10,475,902 | B2 * | 11/2019 | Lee | H10D 64/01 |
| 10,790,280 | B2 * | 9/2020 | Ching | H10D 84/856 |
| 2016/0315086 | A1 | 10/2016 | Yoon et al. | |
| 2018/0277658 | A1 * | 9/2018 | Yun | H10D 62/151 |
| 2019/0103284 | A1 * | 4/2019 | Yu | H10P 14/416 |

* cited by examiner

*Primary Examiner* — Ali Naraghi

(74) *Attorney, Agent, or Firm* — HAYNES AND BOONE, LLP

(57) ABSTRACT

A semiconductor device and method of fabricating thereof where the device includes a fin structure between a first isolation region and a second isolation region. A first source/drain feature is formed over a recessed portion of the first fin structure. The first source/drain feature interfaces a top surface of the first isolation region for a first distance and interfaces the top surface of the second isolation region for a second distance. The first distance is different than the second distance. The source/drain feature is offset in a direction.

20 Claims, 14 Drawing Sheets

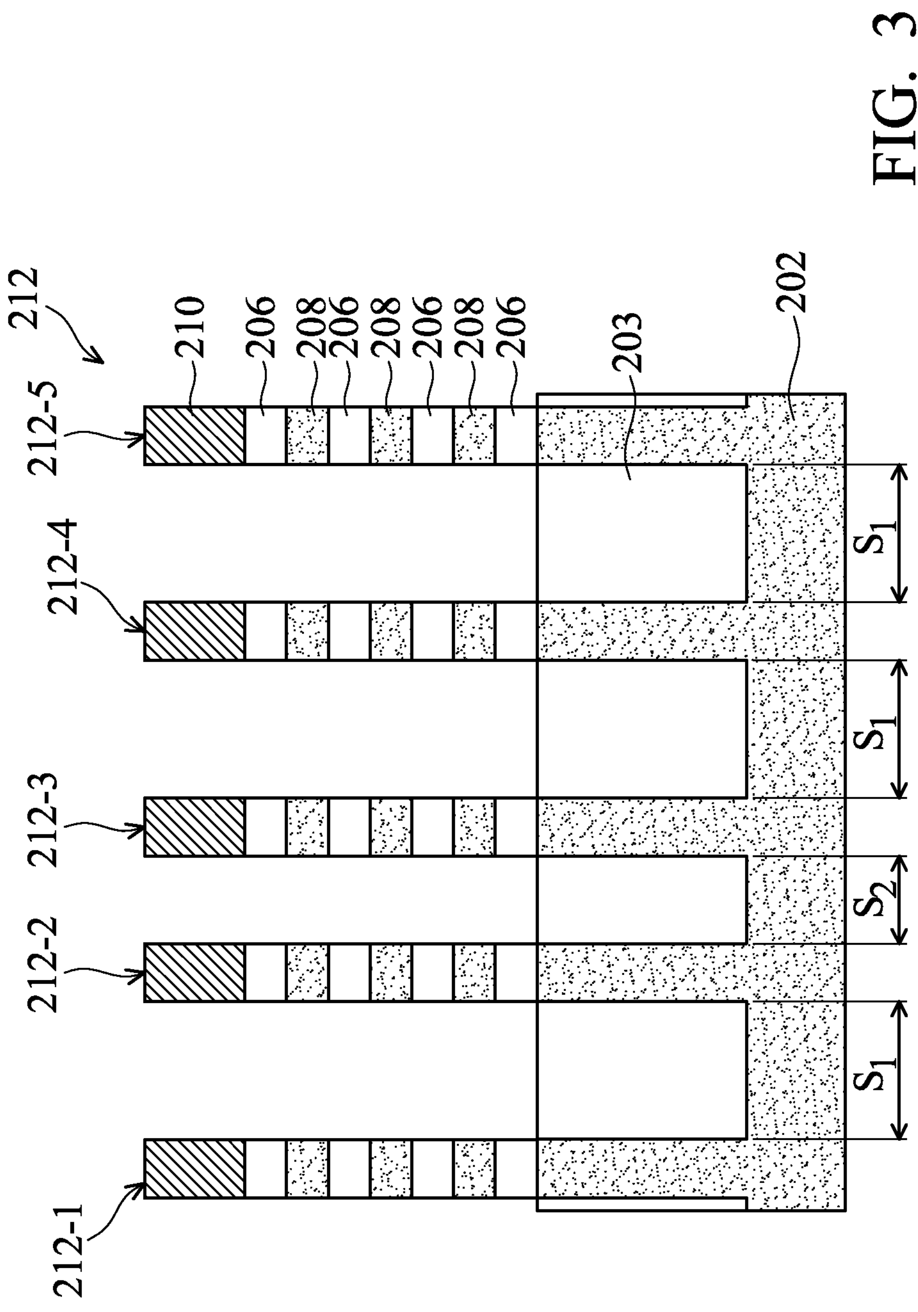
FIG. 3
212
212-5
212-4
212-3
212-2
212-1
210
206
208
206
208
206
208
206
203
202
$S_1$
$S_1$
$S_2$
$S_1$
200

FIG. 7

SEMICONDUCTOR DEVICE HAVING AN OFFSET SOURCE/DRAIN FEATURE AND METHOD OF FABRICATING THEREOF

PRIORITY

This application is a divisional of U.S. patent application Ser. No. 16/949,103, filed Oct. 14, 2020, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) are one example of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Another multi-gate device type includes surrounding gate transistor (SGT) or a gate-all-around (GAA) transistor where its gate structure surrounds the channel regions. The channel region of a GAA transistor may be formed from nanowires, nanosheets, or other nanostructures and for that reasons, this transistor may also be referred to as a nanowire transistor or a nanosheet transistor.

IC devices may include repeating physical design blocks that are referred to as standard cells. Such standard cells may include logic gates or memory bits, such as SRAM cells. One way to achieve smaller geometric sizes is to reduce the dimensions of a standard cell. Because standard cells are repeated multiple times, a dimensional reduction in a standard cell may translate into substantial reduction in size. A standard cell may include multiple active regions (such as multiple fin structures) that are interleaved by isolation material that function to isolate neighboring devices. However, accommodation of sufficient isolation between neighboring devices, such as source/drain features, can be challenging with the decreasing geometric sizes. Therefore, while conventional methods of forming devices be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4, 5A, 6, 7, 8, 9, 10, 11, and 12 illustrate fragmentary cross-sectional views of a structure during a fabrication process according to the method of FIG. 1, according to one or more aspects of the present disclosure.

DETAILED DESCRIPTION

Figure 1:
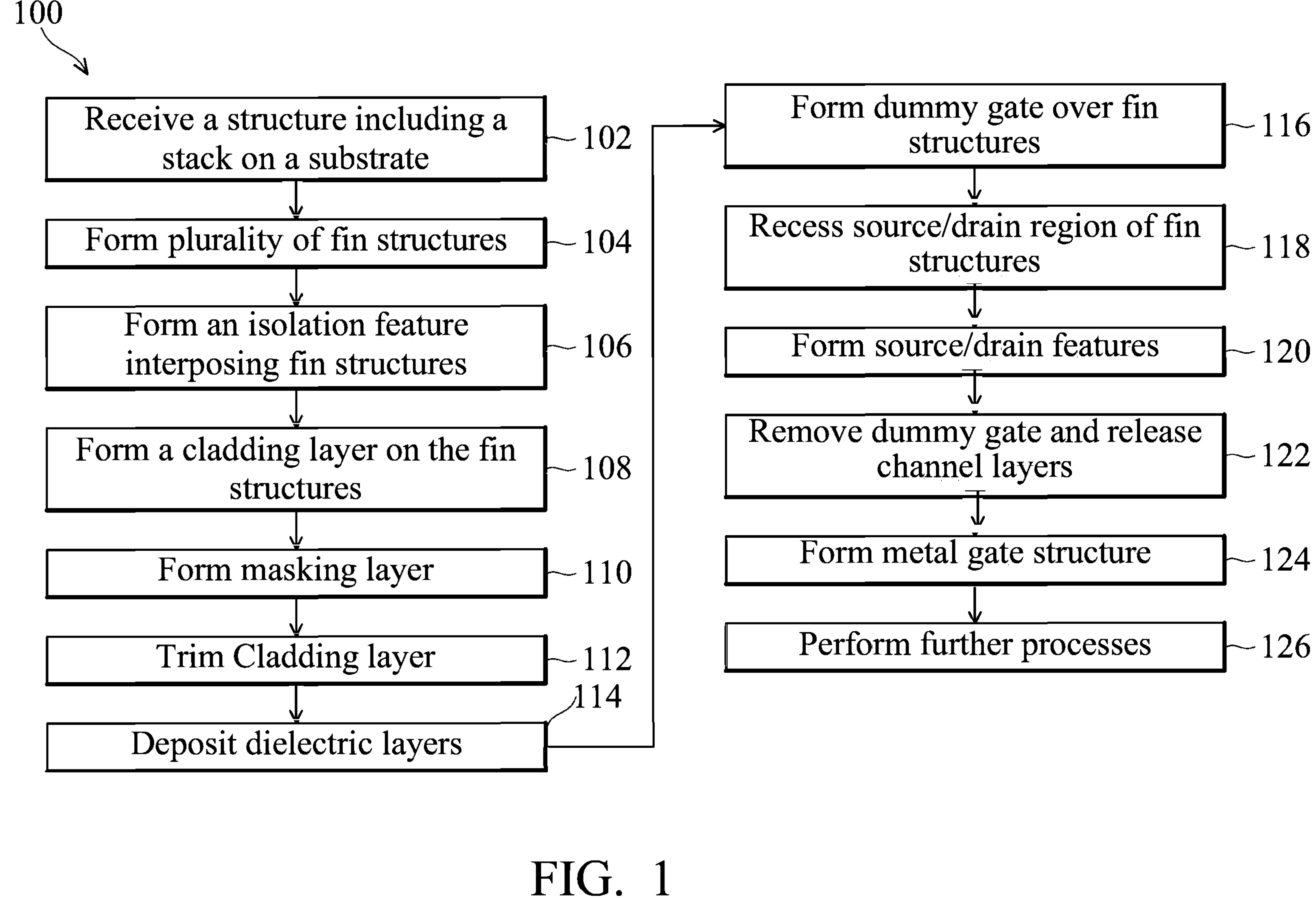
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

As described above, multi-gate transistors may also be referred to as FinFETs, SGTs, GAA transistors, nanosheet transistors, or nanowire transistors. They can be either n-type or p-type. A design such as for a standard cell may include multiple multi-gate transistors that are formed from fin-shaped structures. In some implementations technologies, the fin-shaped structures are parallel to one another and isolation structures are inserted between fin-shaped structures. The isolation structures can in part function to separate source/drain features of neighboring devices formed over neighboring fin-shaped structures. However, the isolation structures maybe insufficient or prevent merging of neighboring source/drain features as the spacing between devices shrinks. Thus, devices and methods providing for sufficient isolation between adjacent features is desired.

The present disclosure is generally related to methods and devices that provide for source/drain structures of neighboring devices to be separated. In some implementations, smaller spacing between adjacent devices can maintain source/drain structure separation by allowing for an off-set of source/drain features away from the smaller spacing region. For example, a cladding layer may be trimmed over regions of smaller separation between features, thus providing additional space for formation of isolation features within said smaller separation region. In some implementations, the off-set source/drain features and methods of fabricating thereof can be implemented while maintaining adequate spacing within which the metal gate structure is formed, thereby reducing the risk of insufficient fill of layer(s) of the metal gate structure. The process and structure of the present disclosure enables reduction and/or improvement of performance of device structures including, for example, enabling reduction and/or improvement of performance of a standard cell. Certain embodiments discussed herein are illustrated by way of a GAA transistor, however, it will be appreciated that the methods and structures discussed herein can also be applied to other structures such as, fin structures of FinFETs.

Figure 5A:
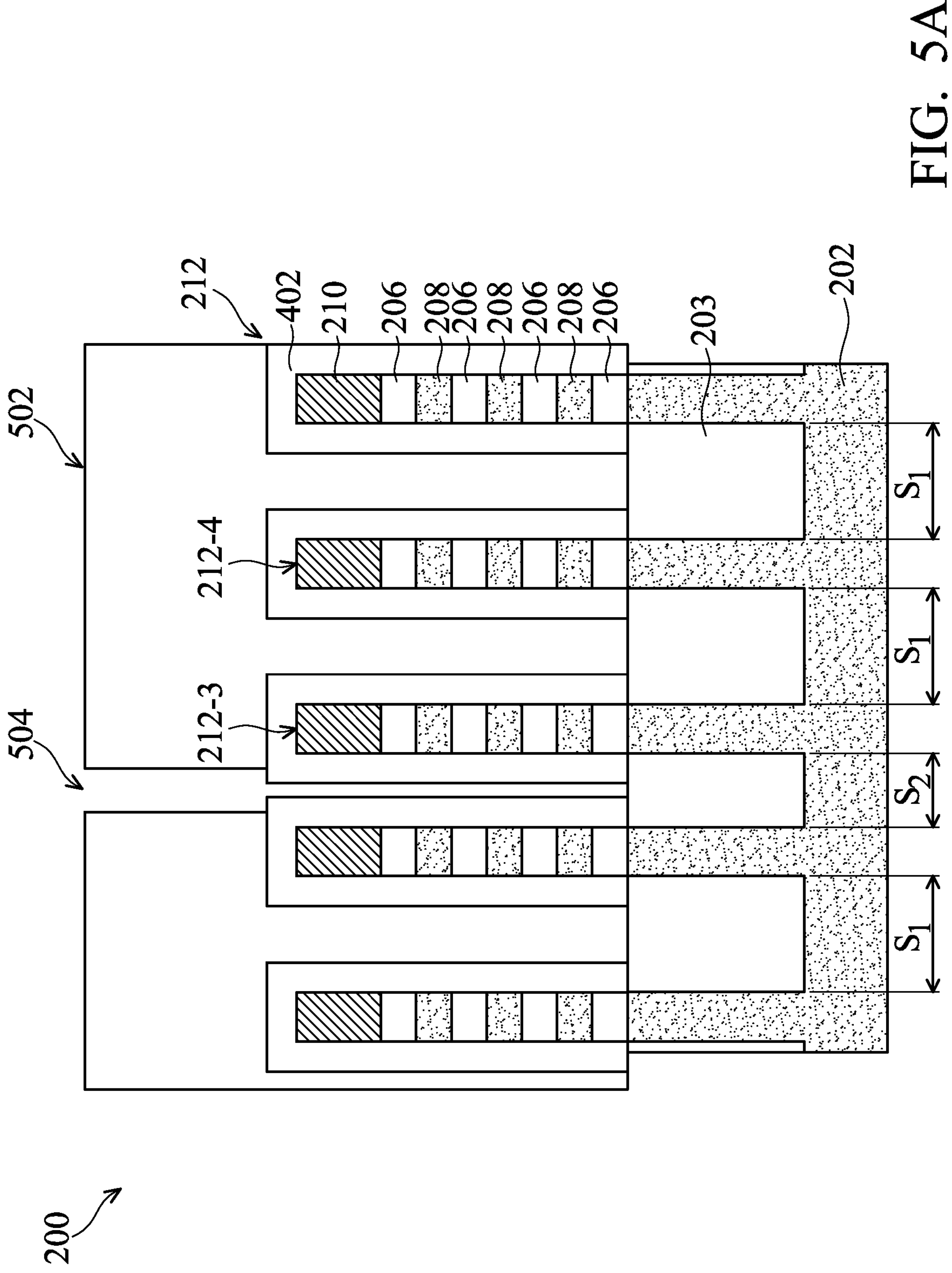
Figure 5B:
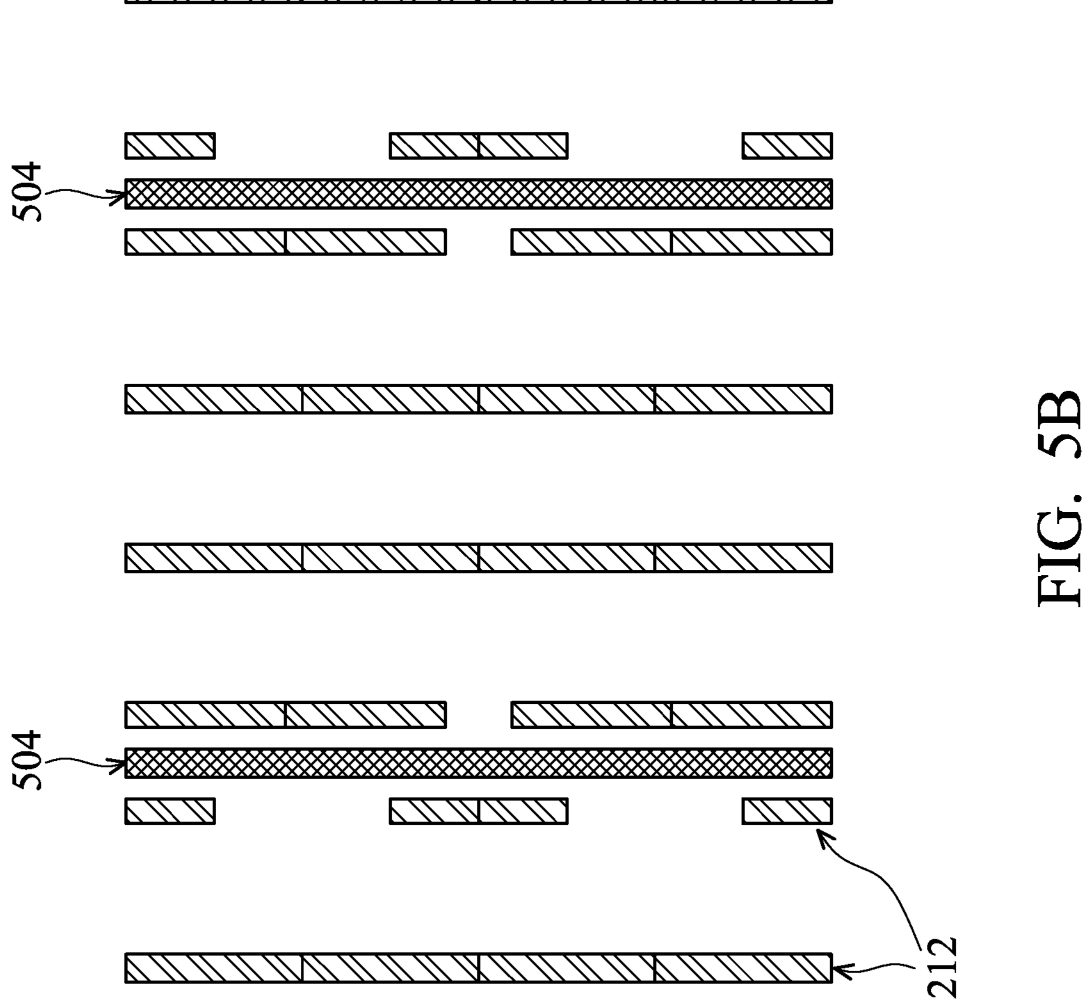
FIG. 5B illustrate fragmentary top view of a structure during a fabrication process according to the method of FIG. 1, according to one or more aspects of the present disclosure.
Figure 6:
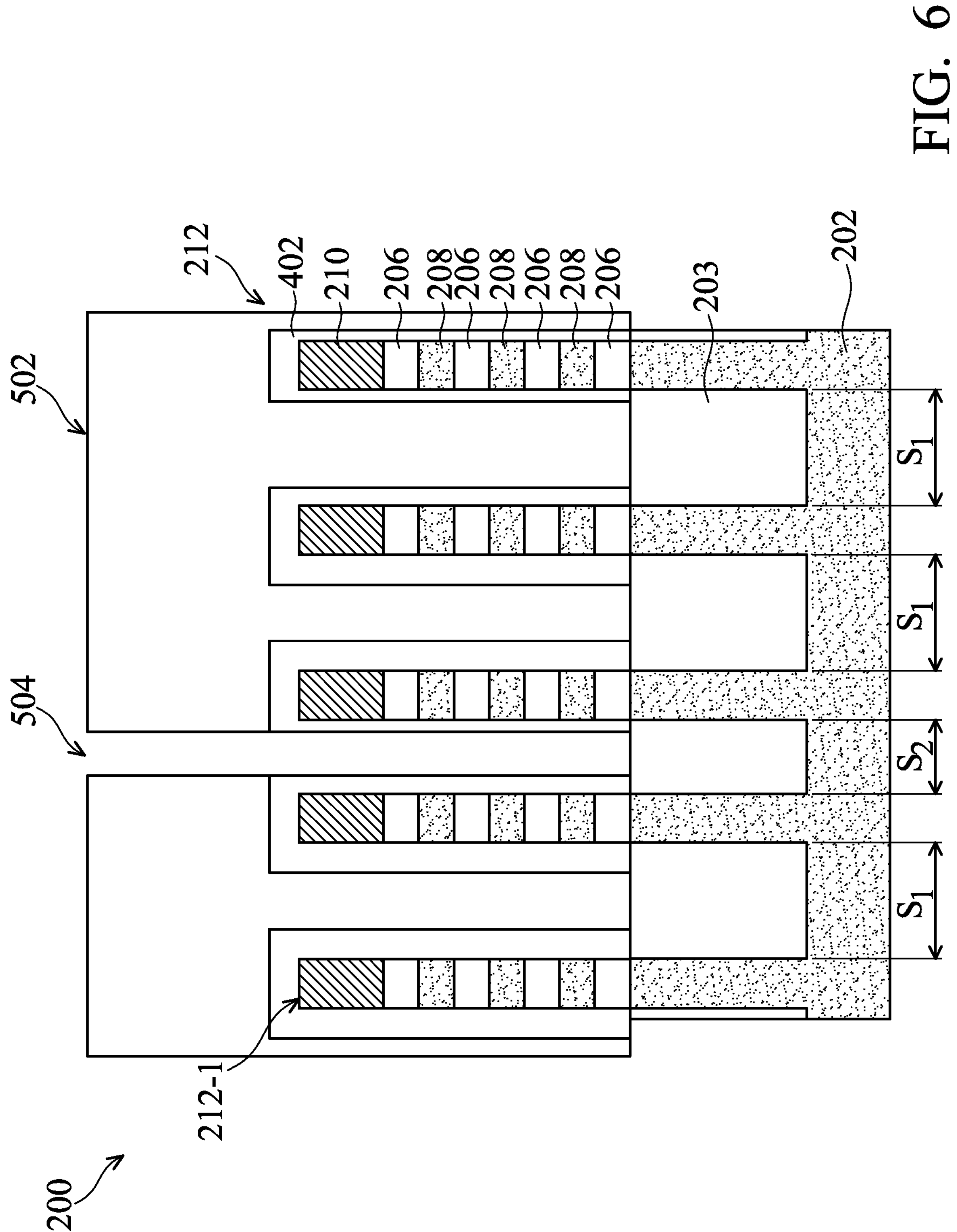
Figure 8:
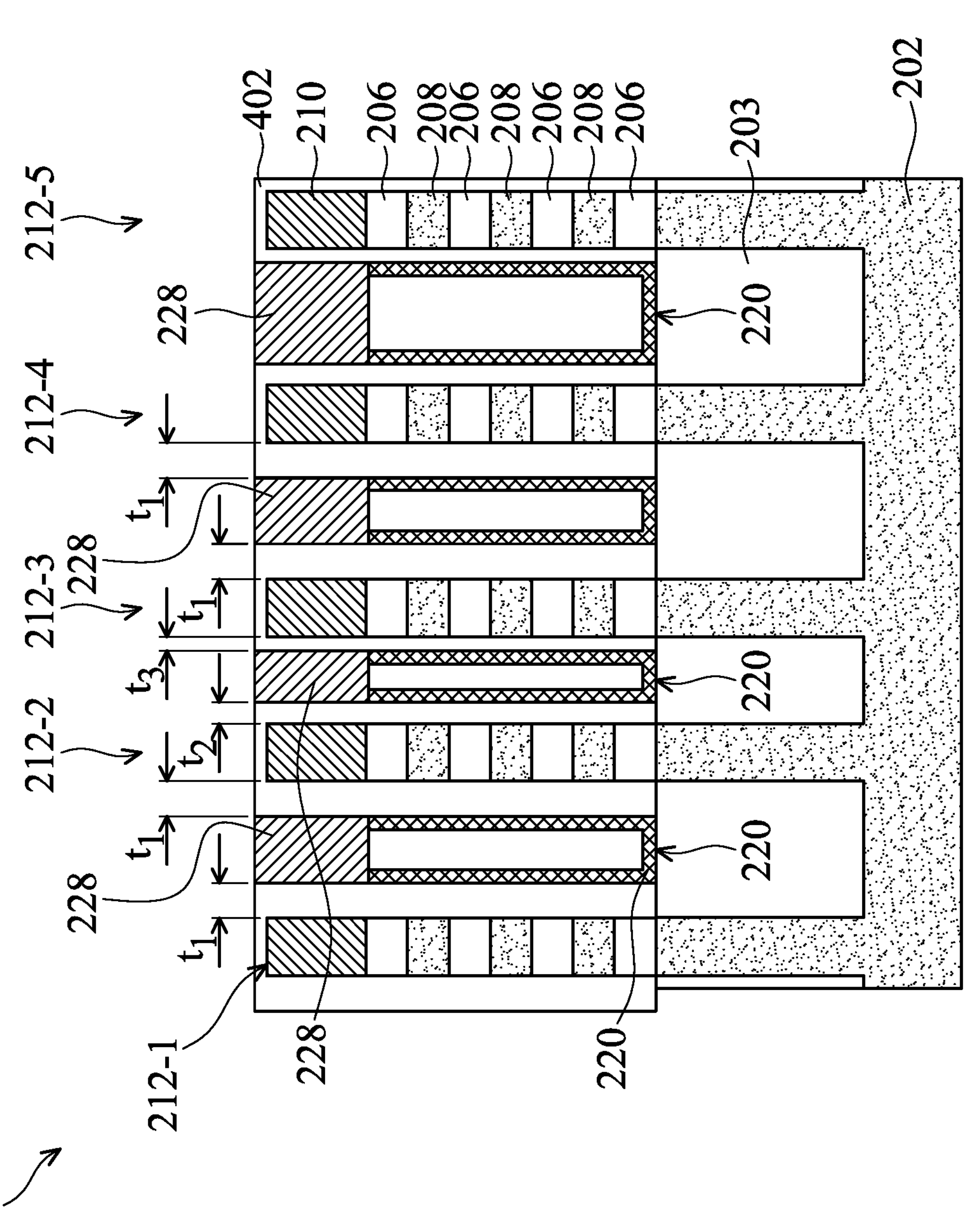
Figure 9:
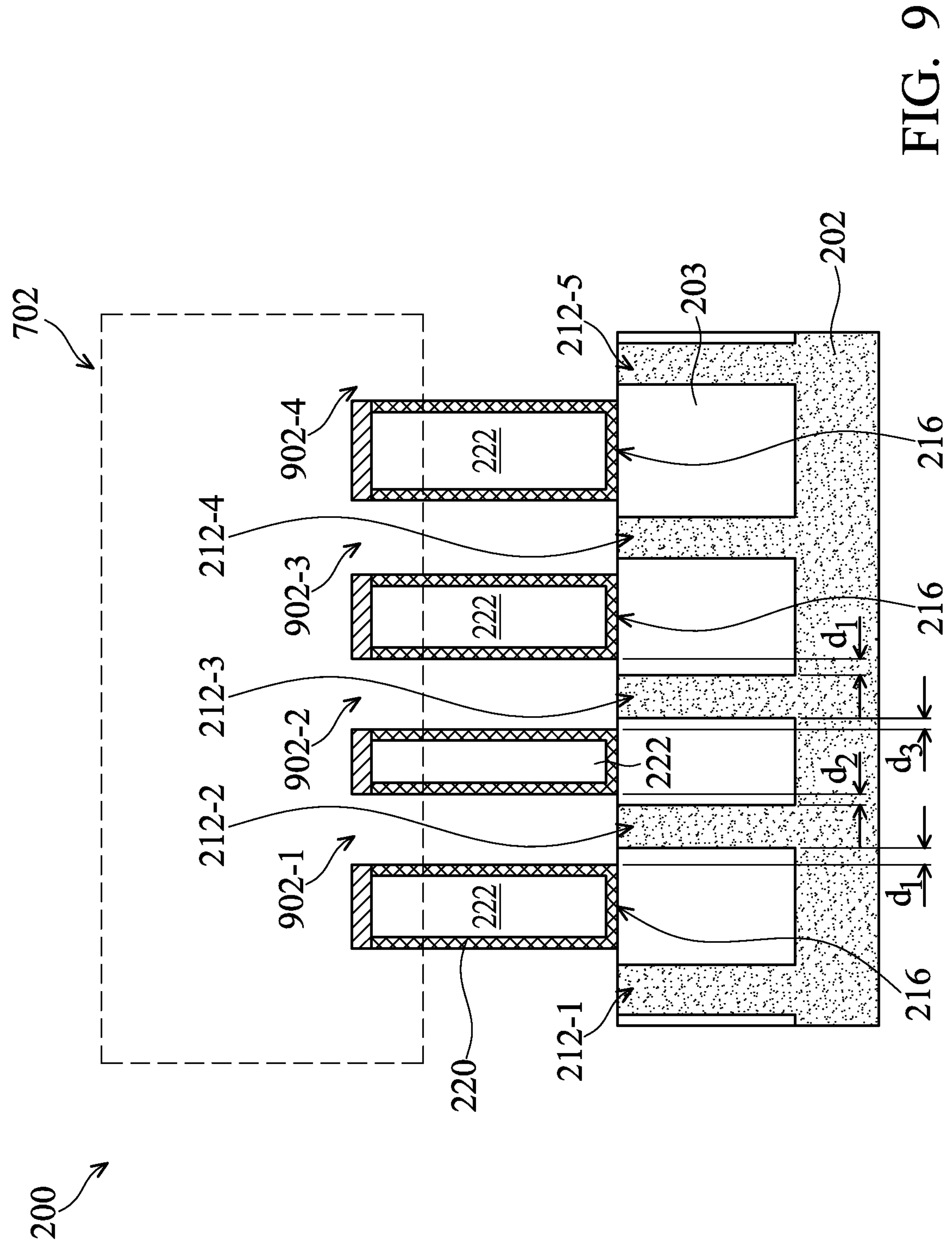

Referring now to FIG. 1, illustrated is a method 100 for fabricating a semiconductor device 200, a fragmentary cross-sectional view of which is illustrated in FIGS. 2, 3, 4, 5A, 6, 7, 8, 9, 10, 11, and 12, and fragmentary top views of which is illustrated in FIG. 5B. Method 100 is exemplary only and is not intended to limit the present disclosure to what is explicitly illustrated therein. Additional steps can be provided before, during, and after method 100, and some steps described can be replaced, eliminated, or moved around for additional embodiments of the method. Not all steps are described herein in detail for reasons of simplicity. Besides what are explicitly shown in figures of the present disclosure, the semiconductor device 200 may include additional transistors, bipolar junction transistors, resistors, capacitors, diodes, fuses, etc. Throughout the present disclosure, like reference numerals denote like features unless otherwise excepted or described.

The method 100 begins at block 102 where a substrate is received. Referring to the example of FIG. 2, a substrate 202 is provided. In an embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

Figure 2:
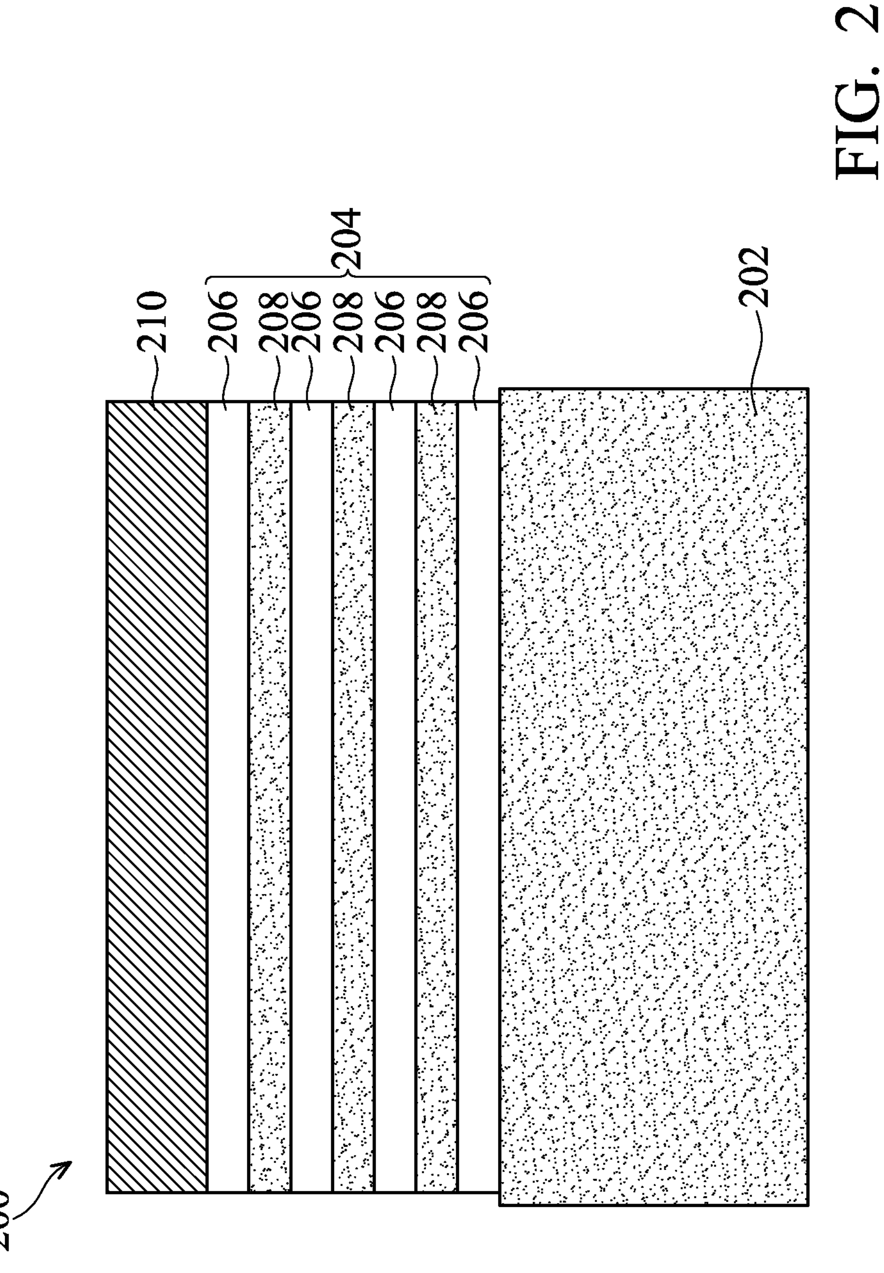
Figure 4:
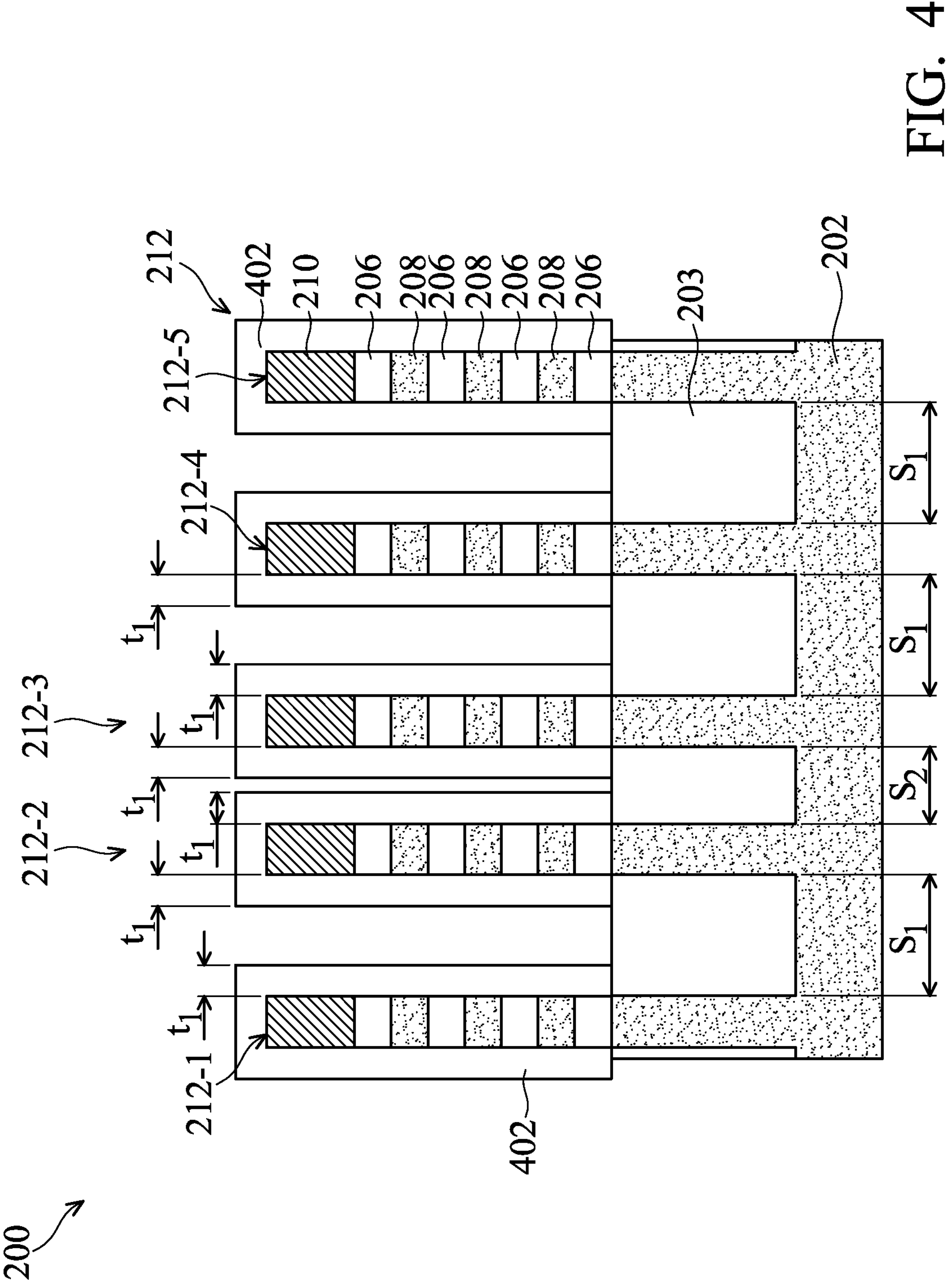

Referring still to FIG. 2, a stack 204 may be disposed on the substrate 202. The stack 204 may include a plurality of channel layers 208 interleaved by a plurality of sacrificial layers 206. The channel layers 208 and the sacrificial layers 206 may have different semiconductor compositions. The sacrificial layers 206 and the channel layers 208 are deposited alternatingly, one-after-another, to form the stack 204. In some implementations, the channel layers 208 are formed of silicon (Si) and sacrificial layers 206 are formed of silicon germanium (SiGe). In some implementations, the additional germanium content in the sacrificial layers 206 allow selective removal or recess of the sacrificial layers 206 without substantial damages to the channel layers 208, as discussed below. In some embodiments, the stack 204 including the sacrificial layers 206 and the channel layers 208 may be formed using an epitaxial process to deposit the materials. Exemplary techniques include but are not limited to CVD deposition techniques (e.g., vapor-phase epitaxy (VPE) and/or ultra-high vacuum CVD (UHV-CVD)), molecular beam epitaxy (MBE), and/or other suitable processes. It is noted that four (4) layers of the sacrificial layers 206 and three (3) layers of the channel layers 208 are alternately and vertically arranged as illustrated in FIG. 2. However, this is for illustrative purposes only and not intended to be limiting beyond what is specifically recited in the claims. The number of layers depends on the desired number of channels members for the semiconductor device 200. In some embodiments, the number of the channel layers 208 is between 2 and 10. For patterning purposes, a hard mask layer 210 may be disposed over the stack 204. The hard mask layer 210 may be a single layer or a multilayer. In one implementation, the hard mask layer 210 includes a silicon oxide layer and a silicon nitride layer.

The method 100 then proceeds to block 104 where a plurality of fin structures is formed. Each of the fin structures defines an active region on the substrate. Referring to the example of FIG. 3, fin structures 212 are formed including fin structures 212-1, 212-2, 212-3, 212-4, and 212-5 respectively. While five (5) fin structures are shown, this is for illustrative purposes only and not intended to be limiting beyond what is specifically recited in the claims. The fin structures 212 may be fabricated using suitable processes including photolithography and etch processes. The photolithography process may include forming a photoresist layer overlying the substrate 202, exposing the photoresist layer to a pattern, performing post-exposure bake processes, and developing the photoresist layer to form a masking element including the photoresist layer. In some embodiments, the masking element further includes the hard mask layer 210. In some embodiments, patterning the photoresist layer to form the masking element may be performed using an electron beam (e-beam) lithography process. As technologies nodes decrease, the fin structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin structures.

The masking element(s) described above may then be used to protect regions of the stack 204 and/or substrate 202 while the fin structures 212 are etched. The recesses may be etched using a dry etch (e.g., chemical oxide removal), a wet etch, reactive ion etching (RIE), and/or other suitable processes. Numerous other embodiments of methods to form the fin structures 212 on the substrate 202 may also be used.

The fin structures 212 extend vertically (Y-direction) above the substrate 202 and length-wise along the Z direction from the substrate 202 (e.g., into the page). Each of the fin structures 212 includes a base portion formed from the substrate 202 and an overlying portion formed of materials of the stack 204.

The fin structures 212 are each spaced a distance in the X-direction from a neighboring fin structure. In some embodiments, including as illustrated in FIG. 3, the fin structures 212 are differently spaced. The first fin structure 212-1 is spaced apart from the second fin structure 212-2 by a first spacing S1. The second fin structure 212-2 is spaced apart from the third fin structure 212-3 by a second spacing S2. The third fin structure 212-3 is spaced apart from the fourth fin structure 212-4 by the first spacing S1. The fourth fin structure 212-4 is spaced apart from the fifth fin structure 212-5 by the first spacing S1. In some embodiments, the second spacing S2 is smaller than the first spacing S1. In some instances, the first spacing S1 may be between about 39 nm and about 50 nm and the second spacing S2 may be between about 32 nm and about 39 nm.

In an embodiment, the second spacing S2 is between fin structure 212-2 and fin structure 212-3, which are both designed for forming a PFET device. In an embodiment, the second spacing S2 is between fin structure 212-2 and fin structure 212-3, which are both designed for forming different device types (e.g., PFET and NFET) or two NFET devices. In an embodiment, the second spacing S2 is between fin structure 212-2 and fin structure 212-3, which are both designed for forming a NFET device. The spacings S1 and/or S2 may be selected to provide the desired performance and size constraints (e.g., packing density) for the device 200.

The method 100 then proceeds to block 106 where isolation features are formed interposing the fin structures. Referring to the example of FIG. 3, isolation features 203, also referred to as shallow trench isolation (STI) features, are formed interposing the fin structures 212 as illustrated in FIG. 3. The isolation features 203 fill the spacings S1 and S2 at the bottom region of the fin structure 212. The isolation features 203 may include dielectric material that is first deposited over the substrate 202, filling the trenches between the fin structures 212 with the dielectric material. In some embodiments, the dielectric material may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, or other suitable process. The isolation features 203 may include a multi-layer structure. After deposition of the insulating material(s) of the isolation features 203, a chemical mechanical planarization process may be performed followed by an etch back process that provides an upper portion of the fin structures 212 extending above a top surface of the isolation features 203. In some embodiments, a field oxide, a LOCOS feature, and/or other suitable isolation features may additionally or alternatively be implemented on and/or within the substrate.

The method 100 then proceeds to block 108 where a cladding layer is formed over the fin structure. The cladding layer may be formed over each fin structure. Referring to the example of FIG. 4, a cladding layer 402 is formed on each fin element 212. In some embodiments, the cladding layer 402 may have a composition similar to that of the sacrificial layers 206. In an embodiment, the cladding layer 402 is formed of silicon germanium (SiGe). In some implementations, the cladding layer 402 and the sacrificial layers 206 include a composition that allows selective removal of the sacrificial layers 206 and the cladding layer 402 during the release of channel layers 208 in a subsequent process by a single etchant, discussed below. In an embodiment, the cladding layer 402 may be epitaxially grown using vapor phase epitaxy (VPE), molecular bean epitaxy (MBE), or other suitable process. In an embodiment, the cladding layer 402 is formed by a deposition process such as CVD process, a subatmospheric CVD (SACVD) process, a flowable CVD process, an ALD process, a PVD process, or other suitable process. After deposition, in some embodiments, operations at block 108 may include etch back processes to remove material of the cladding layer 402, for example conformally deposited, from on the isolation feature 203.

The cladding layer 402 is formed having a thickness t1. The thickness t1 may be substantially consistent between fin features 212. In some embodiments, the thickness t1 is between approximately 9 nm and approximately 12 nm. The cladding layer 402 thickness allows for, upon the cladding layer's removal, creation of a gap between the end of the channel layers and the surrounding dielectric. This gap size affects the path size for the etchant of the channel release process and the available spacing for the subsequent formation of the gate structure around said channels. See FIGS. 11-12. While too thin of a cladding layer 402 may be disadvantageous to the fabrication process (e.g., making a path too narrow for sufficient etchant or space too small for the multi-layer gate deposition), too thick of a cladding layer may increase the device footprint and/or provide other implications to the device performance. For example, the space provided by the cladding layer 402 may determine gate size and/or in some embodiments where inner spacers within the gap provided by the removal of the cladding layer 402, the capacitance of the device may be increased by the increased inner spacer dimensions (e.g., larger inner spacer providing area of greater resistance).

The method 100 then proceeds to block 112 where a masking element is formed over the substrate. The masking element may be a photoresist layer, patterned to provide one or more openings. Referring to the example of FIG. 5A, a masking element 502 is formed over the substrate 202. The masking element 502 has an opening 504 overlying the spacing between fin elements 212 having a length S2. An embodiment of the opening 504 is also illustrated in FIG. 5B.

As a reminder, the length S2 may be less than the length S1 of the space between other active regions provided by fin structures 212. The opening 504 exposes a portion of the cladding layer 402 within the gap having the reduced length S2. In other words, the opening 504 exposes a portion of the cladding layer 402 on the sidewalls of the fins defining the spacing having a length S2. In an embodiment, a distance d1 of the cladding layer on a first sidewall of the fin structure 212-2 is exposed. In an embodiment, a distance d2 of the cladding layer 402 on a first sidewall of the fin structure 212-3 is exposed. In some embodiments, d1 is substantially equal to d2. The distance d1 and the distance d2 are each less than thickness t1 of the cladding layer 402. The masking element 502 covers the remainder of the device 200. The masking element 502 also covers a second portion of the cladding layer 402 on the sidewalls defining the spacing having a length S2, the second portion having a thickness t1−d1 or t1−d2, respectively. It is noted that in the present illustration, a single opening 504 is formed in FIG. 5A. However, this is exemplary only and other openings including other openings over gaps between fin elements that are spaced a distance S2, or in some embodiments, spaced a distance that is smaller than S2, may be possible. FIG. 5B is illustrative of a top view a portion of a structure including the device 200. FIG. 5B illustrates a repeating configuration of five (5) active regions, in some embodiments, this provides a portion of a standard cell such as an SRAM cell. In some embodiments, the trim process may be performed for at least one region of each standard cell.

To form the masking element 502, in some implementations, a photoresist layer is first coated over the device 200 using spin-on coating or a suitable process. To pattern the photoresist layer to form the masking element 502 or portion thereof, the photoresist layer is soft-baked, exposed to radiation transmitting through or reflected from a photomask, baked in a post-exposure bake process, developed in a developer solution, rinsed and dried. The masking element 502 may in some implementations include a multi-layer resist, antireflective coatings, hard mask layers, and/or other suitable patternable layers.

The method 100 then proceeds to block 112 where the cladding layer is trimmed at regions defined according to the masking layer. In an embodiment, the regions of the cladding layer abutting the sidewalls of the fins adjacent a narrower gap between fins are trimmed. In other words, the cladding layer within the regions of reduced spacing between active regions is trimmed. Thus, for those regions of reduced spacing between fins 212, additional space is provided due to the thinner/trimmed cladding layer 402. Referring to the example of FIG. 6, the cladding layer 402 within the opening 504 is etched or trimmed to reduce its thickness. In an embodiment, the cladding layer 402 is reduced in thickness from thickness t1 to thickness t2 and t3 respectively. In an embodiment, thickness t2 is substantially equal to thickness t3. Thickness t2 may be substantially equal to thickness t3 where the alignment of the opening 504 is substantially centered.

In an embodiment, the etching to trim the cladding layer 402 is a suitable dry etching process. For example, a suitable dry etch process may include use of use of an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$ other suitable gases and/or plasmas, and/or combinations thereof.

In an embodiment, t2 is between approximately ¼*t1 and ¾*t1. For example, in a further embodiment t2 is approximately ⅓ of t1. In some embodiments, t2 is between approximately 3 nm and 10 nm. A thickness t1−t2 or t1−t3 remains disposed on the sidewalls over the spacing S2. The selected trimmed thickness t2 may be determinative of the offset degree and determinative of the available gap within which additional dielectric materials are formed, as discussed below in block 114. As discussed above, the trimmed thicknesses t2 and t3 provide for additional space for gap filling subsequent dielectric material(s) in the regions having a dimension S2. If the difference between t1 and t2 and/or t3 is too small, this advantage may not be experienced, and the gap may be too small to allow for adequate gap fill of said materials. If the difference between t1 and t2 and/or t3 is too great, insufficient cladding is provided to perform the cladding layer function (e.g., protect the fin sidewall and/or provide spacing between the dielectric layers and the channel layer ends). See, e.g., FIG. 11. Because one of the functions of the cladding layer 402 is its removal (e.g., with the sacrificial layer 206) creating a path for etchants during the release of the channel layers, if the cladding layer is too thin, the etchant may not be able to sufficiently reach and remove the sacrificial layers 206 of the stack. Similarly, if the cladding layer is too thin, the gate structure may be smaller and/or more difficult to form within the allotted space. In some implementations, a smaller S2 suggests a smaller t2 is desired.

Figure 7:
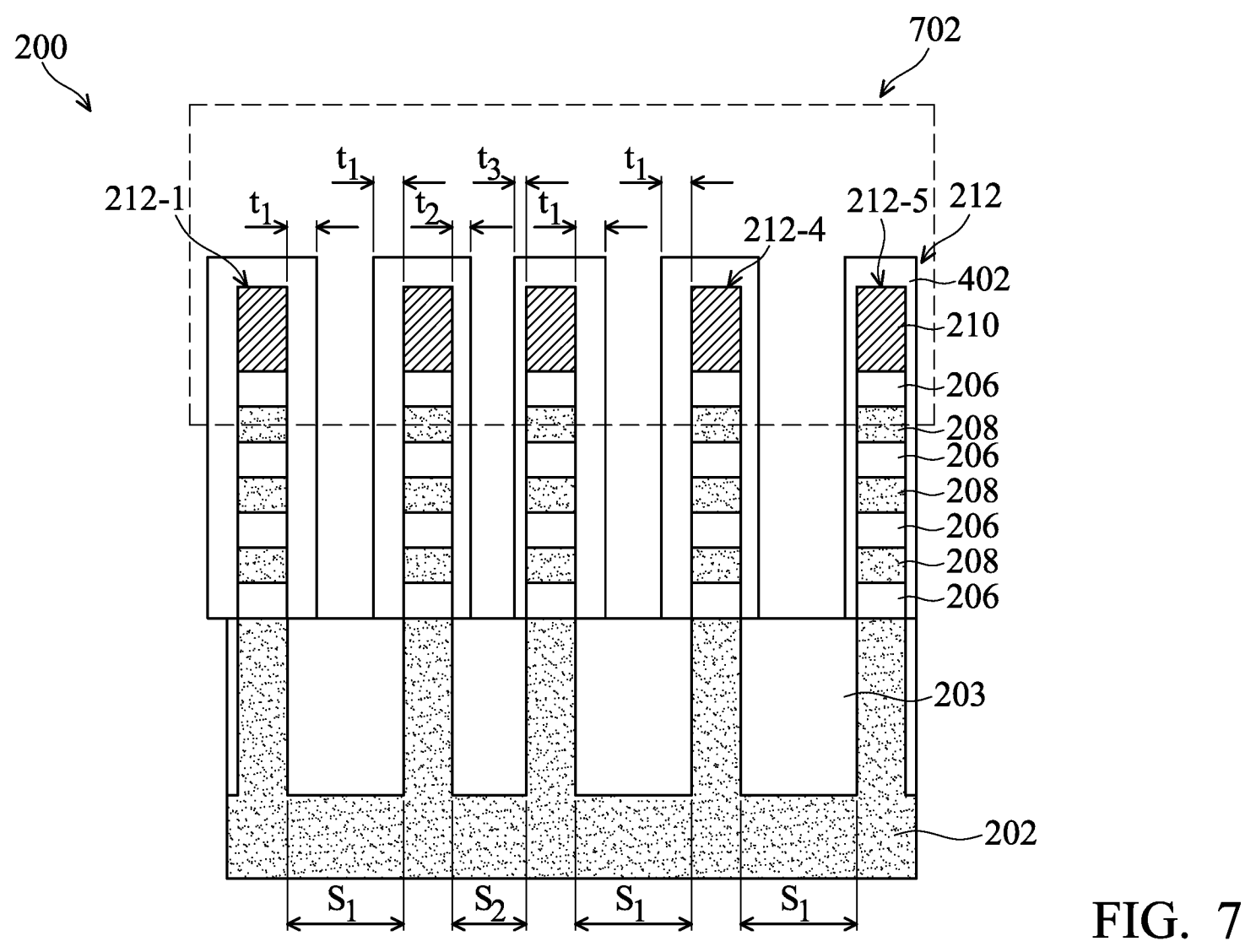

As shown in FIG. 7, after the selective trimming of the cladding layer 402, the masking element 502 may be removed by ashing or other suitable process.

The method 100 may then proceed to block 114 where the method provides for depositing a plurality of dielectric layers over the device. Referring to the example, of FIG. 8, dielectric layers 220, 222, and 228 are illustrated. The dielectric layers 220, 222, and 228 provide an isolation feature or separation structure isolating adjacent features (e.g., source/drain, gates).

In an embodiment, material for forming a first dielectric layer 220 is first conformally deposited over the device 200, including along sidewalls of the fin structures 212 and the top surfaces of the isolation feature 203. The first dielectric layer 220 may be referred to as a bottom contact etch stop layer (BCESL). In some embodiments, the first dielectric layer 220 may include silicon carbonitride (SiCN) or silicon oxycarbonitride (SiOCN), and/or other suitable dielectric material. The first dielectric layer 220 may be deposited using CVD, ALD, or other suitable process(es). After the deposition of the first dielectric layer 220, a second dielectric layer 222 is deposited over the device 200, including over the first dielectric layer 220. In some embodiments, the second dielectric layer 222 may include silicon oxide, or other suitable dielectric materials. The second dielectric layer 222 in some embodiments may be referred to as an interlayer dielectric (ILD). The second dielectric layer 222 may be deposited using spin-on coating, a flowable CVD process and/or other suitable deposition process(es). After the deposition of the second dielectric layer 222, a planarization process, such as an CMP process, may be performed to planarize the top surfaces of the first dielectric layer 220 and the second dielectric layer 222. Anneal processes may also be performed to improve the quality of one of more of the dielectric compositions. After planarization, an etch back process, such as a dry etch, may be performed to provide sufficient space for the dielectric layer 228, discussed below. In some implementations, the first dielectric layer 220 and the second dielectric layer 222, along with dielectric layer 228, may be referred to as a separation structure 216 or fin that provides suitable isolation between the active regions, fin structures 212, and/or the gate structures formed thereon. For example, terminology such as dummy, isolation, dielectric or hybrid fins may also be used to describe the separation structure provided by the dielectric layers.

It is noted that because of the trimmed thickness of the cladding layer 402 (t2 and t3) in the gap spacing having a distance S2, there is sufficient clearance in some embodiments for the first dielectric layer 220 and the second dielectric layer 222 to be formed within the gap S2.

Dielectric or capping layer 228 is deposited over the first and second dielectric layers 220 and 222. In some embodiments, the capping layer 228 may include a high-k dielectric material, such as a metal oxide. A high-k dielectric material refers to a dielectric material that has a dielectric constant greater than that of silicon dioxide (~3.9). Suitable high-k dielectrics may include hafnium oxide, zirconium oxide, titanium oxide, tantalum oxide, or aluminum oxide. In some embodiments, the capping layer 228 may be deposited using CVD, flowable CVD, and/or other suitable deposition method(s), which may be followed by a planarization process, such as a CMP process providing the planar top surface illustrated in FIG. 8. In an embodiment, the dielectric layer 228 has a lower surface that is substantially coplanar between regions of the layer 228. In other words, the surface of layer 228 over the isolation feature 203 having a spacing S1 may be substantially coplanar the surface of layer 228 over the isolation features 203 having a spacing S2.

The method 100 may then proceed to block 116 where the method provides a plurality of dummy gates over respective channel regions of the fin structures. The dummy gates may be placed over channel region(s) of the fin structures, regions which are interposing two source/drain regions of the fin structures. The dummy gates may protect the channel region of the fin structures while further processing occurs, and then be subsequently replaced by a functional gate as discussed below. This may be referred to as a gate replacement process. Other processes and configurations are also possible however for forming the device 200. The dummy gate appears out of the plane of the cross-sectional views including provided in FIG. 9, which is providing the source/drain region of the fin structures 212. However, a representation of the dummy gate is provided schematically with dashed-lines to show the relative position of one or more dummy gates 702. Although the dummy gates 702 are shown as a continuous structure that extends lengthwise along the X direction across the fin structures 212, the dummy gate 702 may include more than one dummy gate segment. See, e.g., FIG. 13.

Prior to formation of the dummy gate 702, the hard mask layer 210, cladding 402 and portions of dielectric layer 228 may be etched forming a recess within which the dummy gate 702 extends.

Each of the dummy gates 702 may include a dummy dielectric layer and a dummy gate electrode. In some embodiments, the dummy gate 702 may be formed by various process steps such as layer deposition, patterning, etching, as well as other suitable processing steps. Exemplary layer deposition processes include low-pressure CVD, CVD, plasma-enhanced CVD (PECVD), PVD, ALD, thermal oxidation, e-beam evaporation, or other suitable deposition techniques, or combinations thereof. The patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy dielectric layer may include silicon oxide and the dummy electrode layer may include polycrystalline silicon (polysilicon). The dummy gate 702 may include one or gate spacers may be deposited along its sidewalls.

The method 100 then proceeds to block 118 where the source/drain region(s) of the fin structure(s) are recessed. The fin structure is etched to form a trench or opening in which the source/drain feature, discussed below with reference to block 120, is formed. Referring to the example of FIG. 9, trenches 902 are formed by recessing the source/drain regions of fin structures 212. The trenches 902 are annotated 902-1, 902-2, 902-3, and 902-4 respectively. The trenches 902 may be formed by a dry etch process and/or other suitable etch process(es). For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. During forming the recess of the source/drain region of the fin structures 212, the cladding layer 402 is also removed, in some embodiments concurrently, from the source/drain region of the fin structures 212.

The trenches 902 expose a top surface of the recessed fin structures 212 and adjacent regions of the top surface of the isolation features 203. Following from the trimming of the cladding layer, the region of the top surface of the isolation feature 203 that has a reduced length S2 is exposed at a length d2 or d3, respectively. In an embodiment, d2 is substantially equal to d3. The region of the top surface of the isolation feature 203 that has a relatively larger length S1 is exposed at a length d1. The length d1 is greater than the length d2 or length d3. In an embodiment, the length d2 is approximately ¼ to ¾ of the length d1; in a further embodiment, the length d2 is approximately ⅓ of the length d1. In an embodiment, the length d3 is ¼ to ¾ of than the length d1; in a further embodiment, the length d3 is approximately ⅓ of the length d1. The length d1 may be substantially equal to the thickness t1. The length d2 may be substantially equal to the thickness t2; the length d3 may be substantially equal to the thickness t3. It is noted that the length d2 and the length d3 are resultant of the cladding layer 402 thicknesses having been trimmed. Thus, relative comparison of the length d1 (untrimmed cladding layer) and the length d2, d3 (trimmed cladding layer) are as discussed above with reference to t1, t2 and t3. It is noted that for an active region (fin 212), one side has a distance d1 (cladding thickness t1) while the opposing side has a distance d2 (cladding thickness t2). Thus, one side gains the benefits of a larger cladding layer, while the other side sacrifices the benefits of the thicker cladding layer but gains the benefits of additional space within the dielectrics 220, 222 are formed.

Thus, provided in some embodiments, there are trenches that are offset from a top surface or centerline of the fin structure 212. Specifically, trench 902-1 and trench 902-2 each expose a greater distance (d1) of isolation feature 203 on one side of the respective fin structure 212-2 and 212-3 than the other side of the respective fin structure where a decreased distance (d2 or d3) of the isolation feature 203 is exposed. Other trenches such as exemplified by trench 902-3 are substantially symmetrical where the region of exposed isolation feature 203 is substantially the same (e.g., d1) one each side of the fin element 212.

The method 100 then proceeds to block 120 where source/drain features are formed over the recessed fin structures. The source/drain features may be epitaxially grown on a seed area including the top surface of the recessed fin structure. In some embodiments, the epitaxial process may be vapor-phase epitaxy (VPE), ultra-high vacuum CVD (UHV-CVD), molecular beam epitaxy (MBE), and/or other suitable processes. Referring to the example of FIG. 10, source/drain features 1002, annotated as 1002-1, 1002-2, 1002-3, 1002-4, and 1002-5, are formed over the recessed fin elements 212. The source/drain features 1002 may be epitaxially grown and suitably doped to provide the relevant type of conductivity (n-type or p-type). In various embodiments, the semiconductor material layer grown to form the source/drain features 1002 may include Ge, Si, GaAs, AlGaAs, SiGe, GaAsP, SiP, SiC, and/or other suitable material. The source/drain features 1002 may be formed by one or more epitaxial processes. In some embodiments, the source/drain features 1002 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 1002 are not in-situ doped, and instead an implantation process is performed to dope the source/drain features 1002. In some embodiments, formation of the source/drain features 1002 may be performed in separate processing sequences for each of N-type and P-type source/drain features.

In an embodiment, the source/drain features 1002-2 and 1002-3 are source/drain features for a first type of device (e.g., PFET). In a further embodiment, the source/drain features 1002-1, 1002-4, and 1002-5 are source/drain features for a second type of device (e.g., NFET). Alternatively, other configurations of device types are possible. Because the certain source/drain features 1002 are different from the other source/drain features 1002, they may be formed separately using a masking layer.

The source/drain feature 1002-2 interfaces the isolation feature having the width S1 for a distance d1 and interfaces the isolation feature having the width S2 for a distance d2. The distance d2 is less than the distance d1. The distance d2 and the distance d1 are substantially similar to as discussed above with respect to the trenches 902. The source/drain feature 1002-3 interfaces the isolation feature having the width S1 for a distance d1 and interfaces the isolation feature having the width S2 for a distance d3. The distance d3 is less than the distance d1, and in some embodiments, may be substantially similar to the distance d2. The distance d3 and the distance d1 are substantially similar to as discussed above with respect to the trenches 902.

Figure 10:
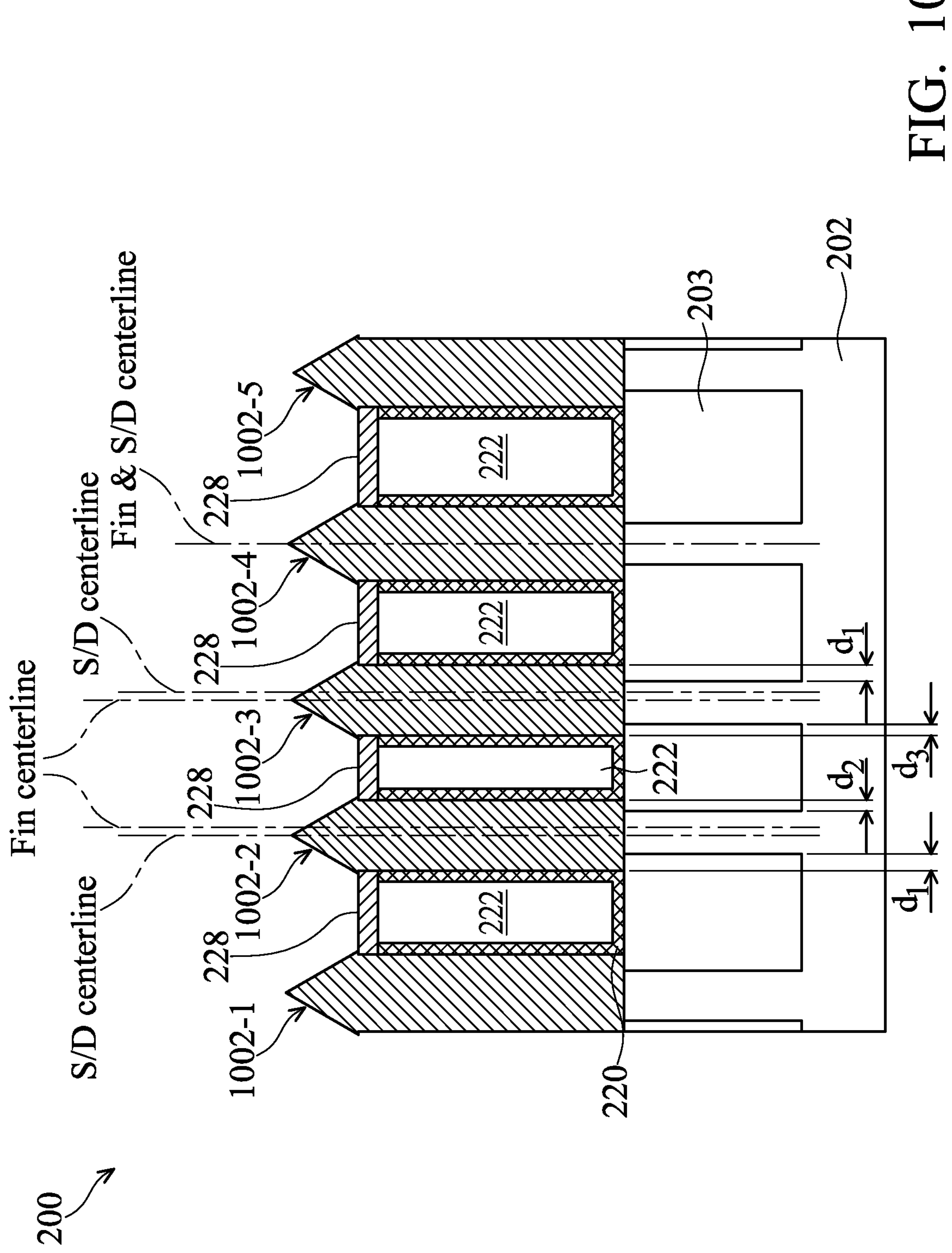
Figure 11:
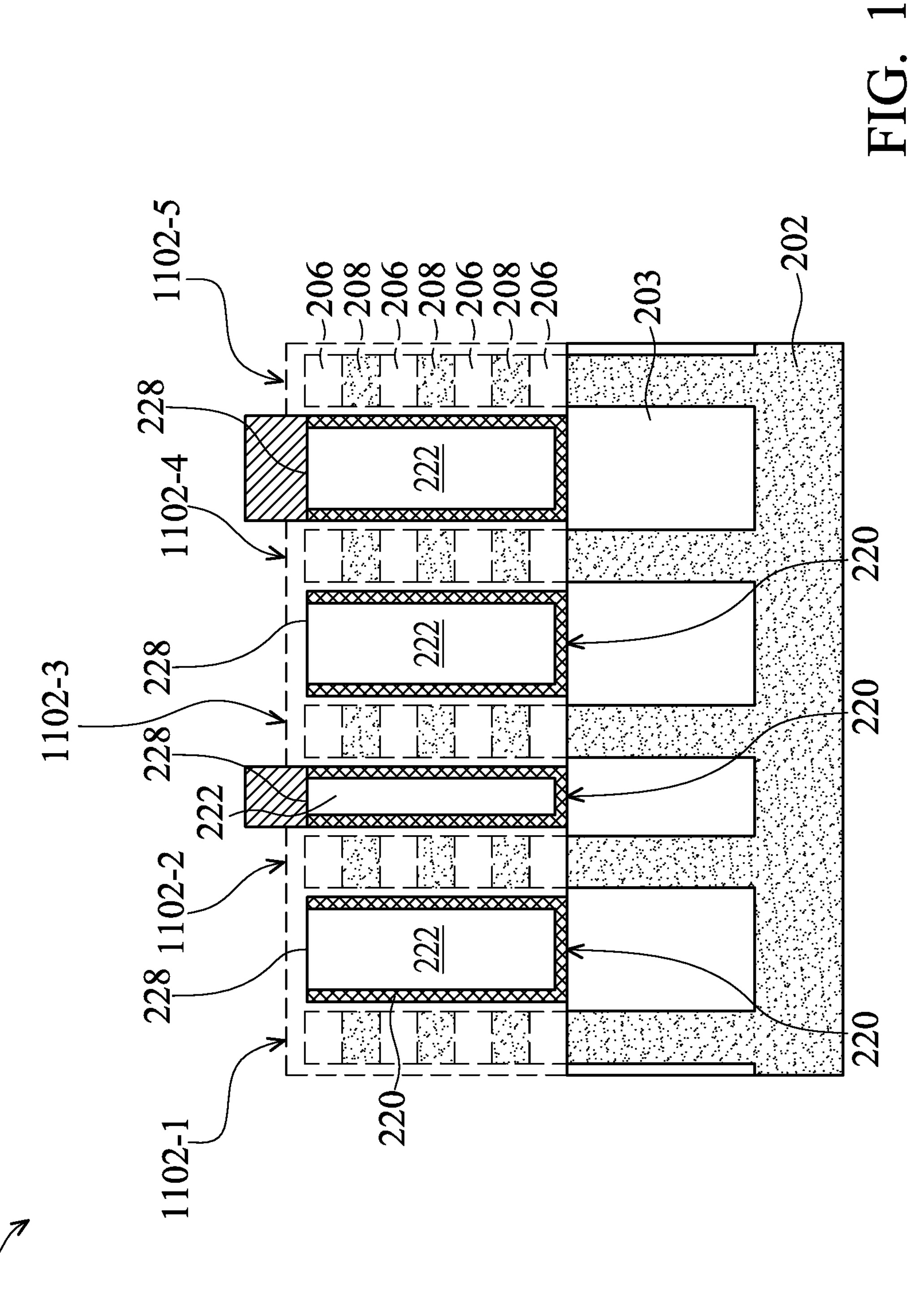
Figure 12:
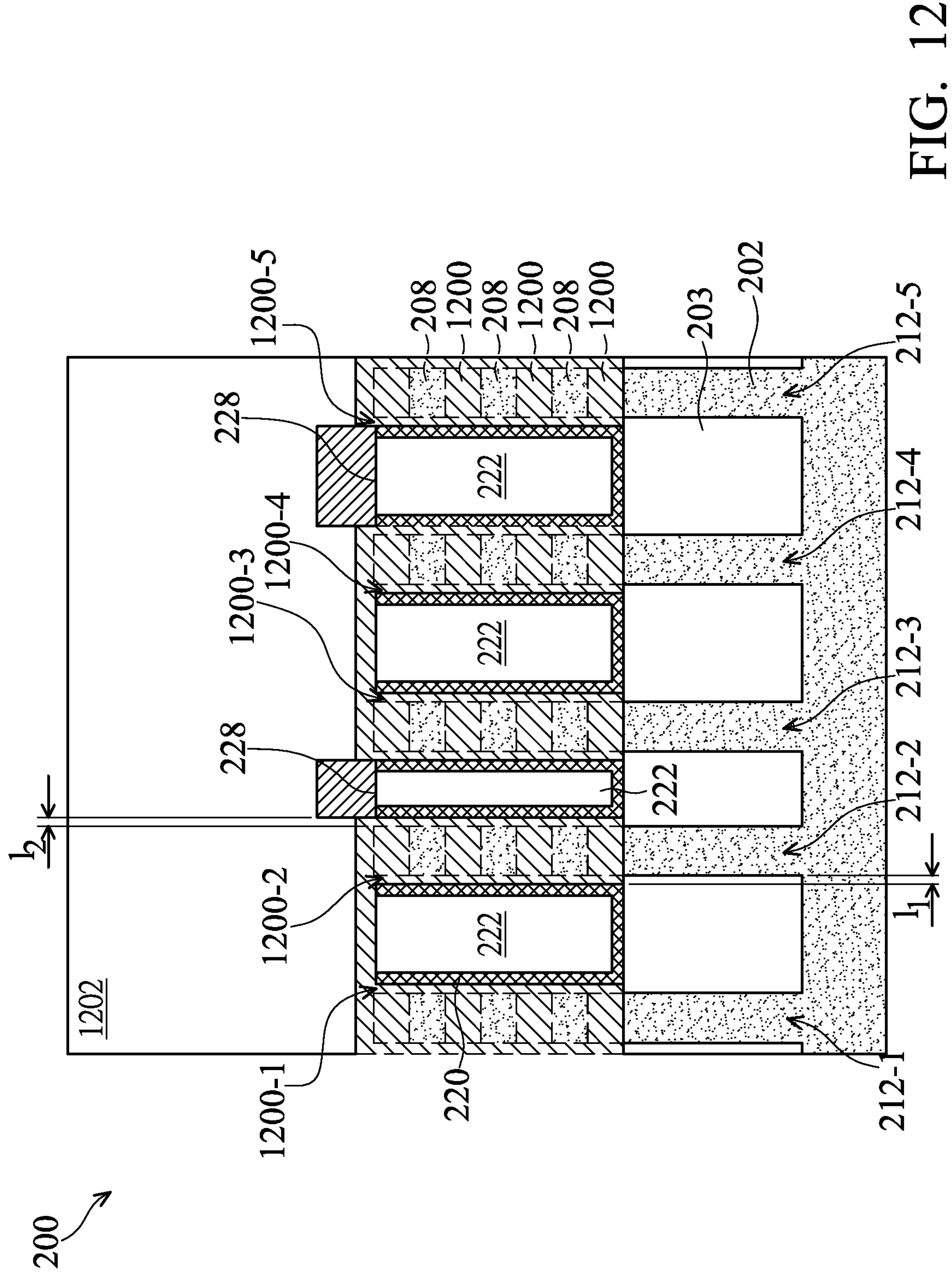

FIG. 10 also illustrates a cross-sectional view of the semiconductor device 200, and also exemplifies certain of the source/drain features 1002 with respect to the fin elements on which the source/drain feature 1002 is formed. For example, source/drain feature 1002-2 is offset from fin structure 212-2. As a further example, source/drain feature 1002-3 is offset from fin structure 212-3. Specifically, the center line (in some embodiments the axis of approximate symmetry) of the source/drain features 1002-2 and 1002-3 is offset from the center line of the respective fin structure 212 on which it is formed. In an embodiment, the center line is offset a distance of d1−d2 and a distance of d1−d3 respectively. In an embodiment, the source/drain feature 1002-2 is offset from the fin structure 212-2 in a first direction, e.g., to the left in the X-direction. In an embodiment, the source/drain features 1002-3 is offset from the fin structure 212-3 in a second direction parallel and opposite the first direction, e.g., to the right in the X-direction. As illustrated in FIG. 10, these directions are perpendicular a top surface of the substrate 202. In contrast, the center line of the source/drain features 1002-1 and 1002-4 and 1002-5 may be substantially aligned with that of the fin structures 212 on which each is formed. It is noted that the offset nature of the source/drain features is also discussed below with respect to FIG. 13.

The method 100 then proceeds to block 122 where the dummy gate(s) are removed and the channel layers of the stack are released in the channel region of the fin structure(s). The dummy gate removal and/or channel layer release may include one or more etching steps. In some embodiments, the selective wet etching includes an APM etch (e.g., ammonia hydroxide-hydrogen peroxide-water mixture). In some embodiments, the sacrificial layers 206 and the cladding layer 402 are formed of silicon germanium, the selective removal includes silicon germanium oxidation followed by a silicon germanium oxide removal. For example, the oxidation may be provided by ozone clean and then silicon germanium oxide removed by an etchant such as $NH_4OH$. Referring to the example of FIG. 11, a cross-sectional view through the channel regions of the fin structures 212 is illustrated (e.g., offset in the z-direction from that of, for example, FIG. 10 through the source/drain region). The dashed lines illustrate the removed dummy gate 702, the removed cladding layer 402, and the removed sacrificial layers 206 from the channel region to form the trenches 1102, annotated as 1102-1, 1102-2, 1102-3, 1102-4, and 1102-5. In some embodiments, the sacrificial layers 206 and the cladding layer 402 are a similar composition and can be removed with a single selective etching process, while the channel layers 208 remain.

In some embodiments, prior to forming the metal gate discussed below, inner spacers may be formed. In some embodiments, the inner spacers are formed after the etch back of the source/drain region of the fin structure 212 and prior to the epitaxial growth of the source/drain features 1002.

The method 100 then proceeds to block 124 where a metal gate structure is formed over the channel region(s). Referring to the example of FIG. 12, metal gate structures 1200, annotated as 1200-1, 1200-2, 1200-3, 1200-4 and 1200-5 are formed over the channel regions of the fin structures 212.

In some embodiments, the metal gate structure includes a gate dielectric layer and a gate electrode formed over the gate dielectric layer. In some embodiments, the gate dielectric layer may include an interfacial layer and a high-k dielectric layer. High-K gate dielectrics, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be deposited using chemical oxidation, thermal oxidation, atomic layer deposition (ALD), chemical vapor deposition (CVD), and/or other suitable method. The high-K dielectric layer may include a high-K dielectric layer such as hafnium oxide. Alternatively, the high-K dielectric layer may include other high-K dielectrics, such as hafnium oxide (HfO), titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The high-K dielectric layer may be formed by ALD, physical vapor deposition (PVD), CVD, oxidation, and/or other suitable methods.

The gate electrode of the gate structure 1200 may include a multi-layer structure, such as various combinations of a metal layer with a selected work function to enhance the device performance (work function metal layer), a liner layer, a wetting layer, an adhesion layer, a metal alloy or a metal silicide. By way of example, the gate electrode may titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode of the gate structure may be formed by ALD, PVD, CVD, e-beam evaporation, or other suitable process. In various embodiments, a planarization process, such as a CMP process, may be performed to remove excessive materials to provide a substantially planar top surface of the gate structures. Certain of the metal gate structures, as illustrated by metal structure 1200-1 and 1200-2 are coupled together. See also, metal gate structure 1200-3 and 1200-4. The dielectric layer 228 may act as a separation structure between portions of the line of gate structure 1200.

In some embodiments, the gate structures adjacent the isolation feature 203 having reduced spacing S2 have one portion of the gate structure 1200 that is thinner (e.g., that adjacent or overlying the isolation feature 203 having a length S2) than the gate structure 1200 on the other side of the channel (e.g., that overlying the isolation structure having a length S1). This can be illustrative by a comparison of the distance $l_1$ which is greater than the distance $l_2$ annotated in gate structure 1200-2, which would also be applicable to gate structure 1200-3. However, gate structures 1200-1 and 1200-4 and 1200-5 may be substantially symmetrical.

The method 100 then proceeds to block 126 where further processing is performed. Such further processes may include, for example, deposition of additional contact etch stop layers (CESL), deposition of additional interlayer dielectric (ILD) layers, and overlying conductive features such as contact vias and metallization lines. In some embodiments, the middle CESL and ILD layer are illustrated by dielectric layer(s) 1202 of FIG. 12. In an example process, a middle CESL is first deposited over the device 200. The CESL may include silicon nitride, silicon oxide, silicon oxynitride, and/or other materials known in the art. The CESL may be deposited using ALD, plasma-enhanced chemical vapor deposition (PECVD) process and/or other suitable deposition or oxidation processes. An ILD layer may be deposited over the CESL. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Contact features may be provided through the dielectric layer(s) 1202 in subsequent processing including contact features extending to the gate structures 1200 and/or the source/drain features 1002.

The smaller second spacing S2 provides benefits allowing for greater packing density of certain transistors (and their active region) in a device or portion thereof. In a standard cell with a plurality of n-type transistors and a plurality of p-type transistors, reducing the spacing of neighboring n-type transistors or neighboring p-type transistors may reduce the X-direction dimension of the cell for greater packing density of the array of cells typically providing a device such as SRAM. In reducing the second spacing S2, providing a separation structure between adjacent features (e.g., source/drain features) may be an increased challenge, this challenge can be addressed by the methods including the cladding trim discussed herein.

Figure 13:
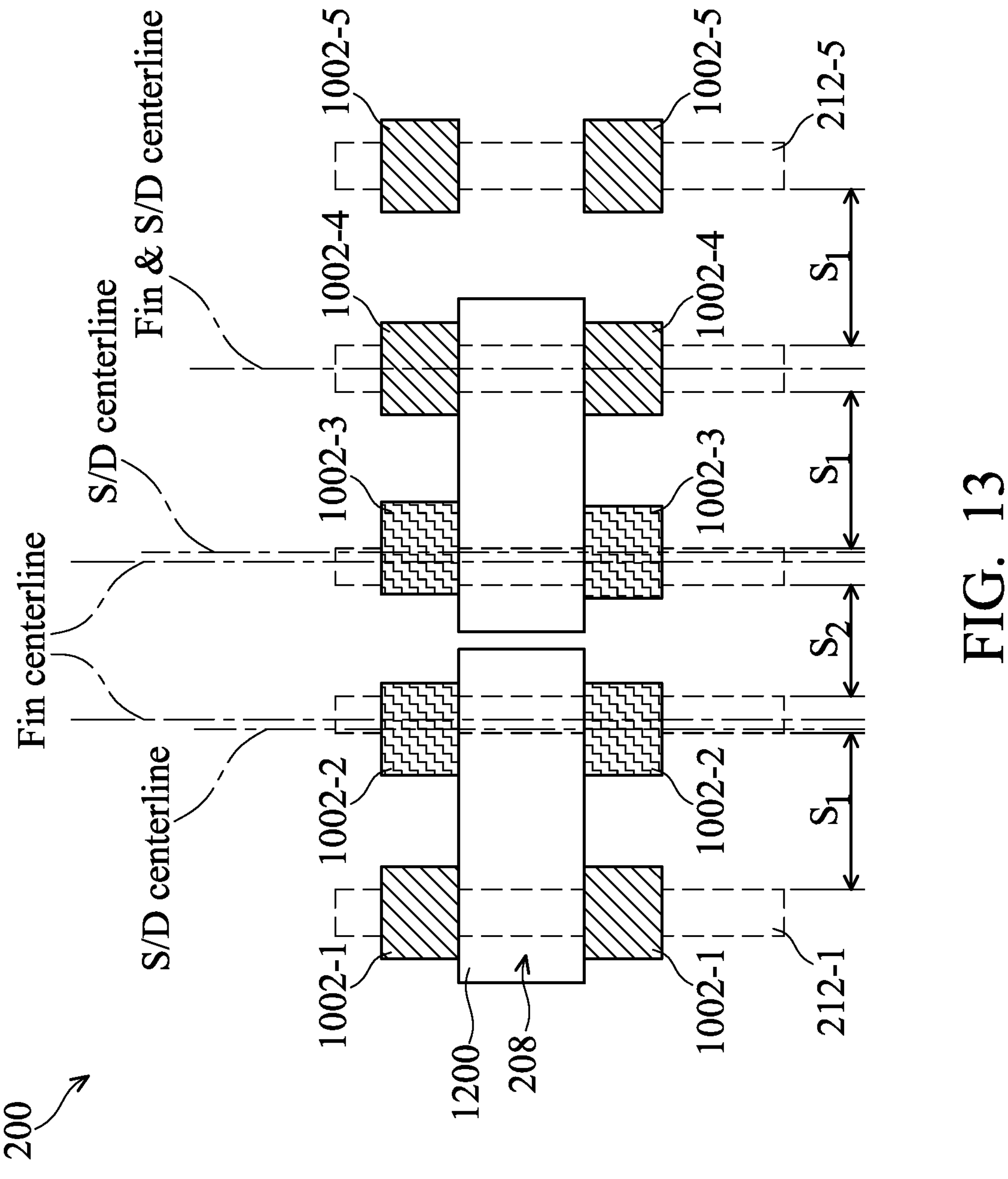
FIG. 13 illustrates a fragmentary top view of an example semiconductor device layout, according to one or more aspects of the present disclosure.

FIG. 13 illustrates a top view of the semiconductor device 200, and also exemplifies the reduction of spacing in the X-direction provided by the reduction to S2 of the transistor spacing. In an embodiment, the device 200 is a portion of an SRAM cell and the illustrated transistors may include functionality such as pull-down transistors, pull-up transistors, and pass-gate transistors as typical of an SRAM cell. In an embodiment, the offset nature of the source/drain features 1002-2 and 1002-3, discussed above is shown by the top view and the outline of the active region, fin structure 212. The source/drain features 1002-2 and 1002-3 are each offset from the fin structures 212 on which they are formed. Specifically, the center line (in some embodiments the axis of approximate symmetry) of the source/drain features 1002-2 and 1002-3 is offset from the center line of the respective fin structure 212 on which it is formed. In an embodiment, the center line is offset a distance of t1–t2. In an embodiment, the source/drain feature 1002-2 is offset from the fin structure 212-2 in a first direction, e.g., to the left in the X-direction as shown in the top view. In an embodiment, the source/drain features 1002-3 is offset from the fin structure 212-3 in a second direction parallel and opposite the first direction, e.g., to the right in the X-direction as shown in the top view. It is noted that this direction in the top view is parallel a top surface of the substrate 202. In contrast, the center line of the source/drain features 1002-1 and 1002-4 and 1002-5 may be substantially aligned with that of the fin structures 212 on which each is formed. The offset of source/drain features 1002-2 and 1002-3 respectively allows for an increased opening between the features over the spacing S2 between the respective fin structures. This increased opening can accommodate various insulating materials such as discussed above.

In one exemplary aspect, the present disclosure is directed to a semiconductor device including a first isolation region and a second isolation region over a substrate. A first fin structure extends between the first isolation region and the second isolation region. A first source/drain feature is formed over a recessed portion of the first fin structure. The first source/drain feature interfaces a top surface of the first isolation region for a first distance and interfaces the top surface of the second isolation region for a second distance. The first distance is different than the second distance.

In a further embodiment, the device also includes a second source/drain feature formed over a recessed portion of a second fin structure. The second source/drain feature interfaces the top surface of the first isolation region for a third distance on a first side of the second fin structure and interfaces the top surface of a third isolation region for the second distance on a second side of the second fin structure. The second side is opposite the first side and the second distance is different than the third distance. In some implementations, the third distance is substantially equal to the first distance. In an embodiment, the first isolation region and the second isolation region are each a shallow trench isolation (STI) feature. In an embodiment, the second distance is between ¼ and ¾ of the first distance.

In an embodiment, the device further includes a second fin structure. The first isolation region interposes the second fin structure and the first fin structure. The device may further include a third fin structure. The second isolation region interposes the first fin structure and the third fin structure. The first isolation region extends a first length between the first fin structure and the second fin structure and the second isolation region extends a second length between the first fin structure and the third fin structure. In some implementations, the second length is different than the first length. In an embodiment, a second source/drain feature is formed on the second fin structure and the second source/drain feature interfaces the first isolation region for approximately the first distance. In some embodiments, a center line of the first source/drain feature is offset from a center line of the first fin structure.

In another of the broader devices discussed herein a semiconductor device, includes a substrate having a first fin structure and a second fin structure. A first isolation feature extends from a first sidewall of the first fin structure to a second sidewall of the second fin structure. A second isolation feature is adjacent a third sidewall of the first fin structure. The third sidewall opposes the first sidewall and a third isolation feature is adjacent a fourth sidewall of the second fin structure. The fourth sidewall opposes the second sidewall. In the device, a first source/drain feature is disposed over the first fin structure and a second source/drain feature is disposed over the second fin structure. The first source/drain feature is offset in a first direction from the first fin structure and the second source/drain feature is offset in a second direction from the second fin structure. The first direction is parallel and opposite the second direction.

In a further embodiment, the first source/drain feature has an interface with the second isolation feature of a first length and an interface with the first isolation feature of a second length. The second length may be less than the first length. In an embodiment, the second source/drain feature has an interface with the first isolation feature of a third length and an interface with the third isolation feature of a fourth length. The third length may be less than the fourth length. The fourth length is approximately equal to the first length, and the second length is approximately equal to the third length.

In a further embodiment, the offset in the first direction includes a center-line of the first source/drain feature shifted toward the first direction from a center-line of the first fin structure. The center-line is an imaginary line extending perpendicular to a top surface of the substrate. In an embodiment, the offset in the first direction includes a center-line of the first source/drain feature shifted toward the first direction from a center-line of the first fin structure. In this embodiment, the center-line is an imaginary line extending parallel to a top surface of the substrate.

In one of the broader embodiments of a method of forming a device discussed herein, the method includes providing a first fin structure disposed over a substrate. A cladding layer of a first thickness is formed on sidewalls of the first fin structure. A masking element is formed over the substrate including over a first portion of the cladding layer on the first fin structure; the masking element includes an opening over a second portion of the cladding layer on the first fin structure. The method further includes etching the second portion of the cladding layer to reduce a thickness of the cladding layer on first fin structure to a second thickness. An isolation structure is formed abutting the cladding layer having the second thickness.

In a further embodiment, the method includes after forming the isolation structure, removing the cladding layer and recessing the first fin structure and growing a first source/drain feature over the recessed first fin structure. In an embodiment, forming the cladding layer includes depositing silicon germanium. In some implementations, the method of forming the isolation structure includes depositing a contact etch stop layer (CESL), depositing an interlayer dielectric layer (ILD), and depositing a high-k dielectric layer over the CESL and the ILD. In an embodiment, the method includes forming a dummy gate over the first fin structure and the cladding layer after etching the second portion of the cladding layer. In an embodiment, the growing the first source/drain feature includes growing a semiconductor material that has a first interface with a first shallow trench isolation (STI) feature adjacent the first fin structure and a second interface with a second STI feature adjacent an opposing side of the first fin structure. The first interface may be longer than the second interface.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
- providing a first fin structure disposed over a substrate;
- forming a cladding layer of a first thickness on sidewalls of the first fin structure;
- forming a masking element over the substrate including over a first portion of the cladding layer on the first fin structure and providing an opening in the masking element over a second portion of the cladding layer on the first fin structure;
- through the opening, etching the second portion of the cladding layer to reduce a thickness of the cladding layer on the first fin structure to a second thickness;
- forming an isolation structure abutting the cladding layer having the second thickness;
- after forming the isolation structure, removing the cladding layer and recessing the first fin structure; and
- growing a first source/drain feature over the recessed first fin structure.

2. The method of claim 1, wherein the forming the cladding layer includes depositing silicon germanium.

3. The method of claim 1, wherein the forming the isolation structure includes:
- depositing a contact etch stop layer (CESL);
- depositing an interlayer dielectric layer (ILD); and
- depositing a high-k dielectric layer over the CESL and the ILD.

4. The method of claim 1, further comprising:
- forming a dummy gate over the first fin structure and the cladding layer after etching the second portion of the cladding layer.

5. The method of claim 1, wherein the growing the first source/drain feature includes growing a semiconductor material that has a first interface with a first shallow trench isolation (STI) feature adjacent the first fin structure and a second interface with a second STI feature adjacent an opposing side of the first fin structure, wherein the first interface is longer than the second interface.

6. The method of claim 1, wherein the forming the masking element includes depositing photoresist and patterning the photoresist to provide the opening.

7. The method of claim 1, wherein the etching reduces to the second thickness of between approximately ¼ and about ¾ of the first thickness.

8. A method, comprising:

providing a first fin structure and a second fin structure each disposed over a substrate;

forming a cladding layer of a first thickness on sidewalls of the first fin structure and the second fin structure;

forming a masking element over the first fin structure and the second fin structure;

providing an opening in the masking element exposing a portion of the cladding layer on a sidewall of the first fin structure;

etching the cladding layer exposed by the opening to reduce a thickness of the cladding layer on the sidewall of the first fin structure to a second thickness, wherein the masking element remains over the cladding layer on the second fin structure during the etching;

after the etching, forming an isolation structure having a first portion abutting the cladding layer adjacent the first fin structure and a second portion abutting the cladding layer adjacent the second fin structure;

after forming the isolation structure, removing the cladding layer and recessing the first fin structure and the second fin structure; and growing a first source/drain feature over the recessed first fin structure and growing a second source/drain feature over the recessed second fin structure.

9. The method of claim 8, wherein the providing the first fin structure and the second fin structure includes forming fins of a plurality of channel layers and interposing sacrificial layers.

10. The method of claim 9, wherein the providing the first fin structure and the second fin structure further includes forming a hard mask layer over the plurality of channel layers and interposing sacrificial layers.

11. The method of claim 9, wherein the providing the opening exposing the portion of the cladding layer on the sidewall of the first fin structure, includes the masking element remaining over the cladding layer over an opposing sidewall of the first fin structure during the etching.

12. The method of claim 8, wherein a third fin structure interposes the first fin structure and the second fin structure.

13. The method of claim 12, wherein the providing the opening also exposes a portion of the cladding layer on a sidewall of the third fin structure; and etching the cladding layer exposed by the opening reduces a thickness of the cladding layer on the sidewall of the third fin structure.

14. The method of claim 13, wherein the forming the isolation structure includes forming the first portion of the isolation structure abutting the cladding layer on the sidewall of the third fin structure.

15. A method, comprising:

providing a first semiconductor structure;

forming a cladding layer of a first thickness on sidewalls of the first semiconductor structure;

forming a masking element over a first portion of the cladding layer on the first semiconductor structure and providing an opening in the masking element over a second portion of the cladding layer on the first semiconductor structure;

through the opening, etching the second portion of the cladding layer to reduce a thickness of the cladding layer on the first semiconductor structure to a second thickness;

forming an isolation structure abutting the cladding layer having the second thickness;

after forming the isolation structure, removing the cladding layer and recessing the first semiconductor structure; and growing a first source/drain feature over the recessed first semiconductor structure.

16. The method of claim 15, further comprising:

providing a first shallow trench isolation (STI) and a second STI, wherein the first semiconductor structure extends between the first STI and second STI, and wherein the first semiconductor structure extends higher than an upper surface of the first STI and the second STI.

17. The method of claim 16, wherein the first source/drain feature extends over the first STI for a first distance and extends over the second STI for a second distance, wherein the first distance is different than the second distance.

18. The method of claim 16, wherein the forming the cladding layer forms the cladding layer interfacing the upper surface of the first STI and the upper surface of the second STI.

19. The method of claim 15, further comprising:

forming a gate-all-around (GAA) device including the first source/drain feature.

20. The method of claim 15, wherein the first semiconductor structure includes a stack of layers of alternating compositions.

* * * * *